(12) United States Patent
Dewa

(10) Patent No.: US 6,586,315 B1
(45) Date of Patent: Jul. 1, 2003

(54) WHOLE WAFER MEMS RELEASE PROCESS

(75) Inventor: Andrew S. Dewa, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/076,222

(22) Filed: Feb. 14, 2002

Related U.S. Application Data

(60) Provisional application No. 60/342,248, filed on Dec. 21, 2001.

(51) Int. Cl.⁷ ........................ H01L 21/00; H01L 21/301; H01L 21/46; H01L 21/78
(52) U.S. Cl. .................... 438/464; 464/51; 464/462
(58) Field of Search .................... 438/15, 16, 33, 438/68, 113, 462, 464

(56) References Cited

U.S. PATENT DOCUMENTS

| 6,383,833 B1 | * | 5/2002 | Silverbrook | 438/51 |
| 6,387,778 B1 | * | 5/2002 | Bonin et al. | 438/462 |
| 6,444,138 B1 | * | 9/2002 | Moon et al. | 216/79 |

* cited by examiner

*Primary Examiner*—John F. Niebling
*Assistant Examiner*—Viktor Simkovic
(74) *Attorney, Agent, or Firm*—William B. Kempler; W. James Brady, III; Frederick J. Telecky, Jr.

(57) ABSTRACT

A process for manufacturing a wafer having a multiplicity of MEMS devices such as mirrors with gimbals formed thereon is disclosed. The devices on the wafer include features defined by a wide line between features which extend completely through the wafer, and have a ratio of greater than about 4:1 with respect to the narrow lines which separate individual devices. Each individual device is separated by narrow gaps or line widths which are, for example, about 10 μm. Thus, the etching process is controlled such that the features defined by the wide lines are etched completely through, whereas the individual devices are separated by narrow lines which are not etched completely through the wafer. Therefore, the multiplicity of devices remain attached together even after the wafer is released from a backing wafer. Thus, the wafer with the many devices still attached together allows further processing such as packaging, testing, transport, etc. without the required handling of individual devices.

17 Claims, 5 Drawing Sheets

WHOLE WAFER MEMS RELEASE PROCESS

This patent claims the benefit of U.S. Provisional Patent Application No. 60/342,248, filed Dec. 21, 2001, which is incorporated herein by reference.

FIELD OF THE INVENTION

This unit relates generally to apparatus and methods for manufacturing MEMS (micro-electromechanical systems) by forming a multiplicity of such devices on a silicon wafer. More specifically, the invention relates to such a manufacturing process which allows further processing and/or testing before each individual device is separated from the silicon wafer.

BACKGROUND OF THE INVENTION

Texas Instruments presently manufactures a two-axis analog micromirror MEMS device fabricated out of a single piece of material (such as silicon, for example) typically having a thickness of about 115 μm. The die layout consists of an oval micromirror, normally 3.8 mm×3.2 mm supported on a gimbal frame by two silicon torsional hinges. The gimbal frame is attached to the die frame by another orthogonal set of torsional hinges. The micromirror die (i.e. each individual device) is fabricated by etching the 115 μm thick silicon wafer in a specialized ICP (Inductively Coupled Plasma) plasma reactor.

MEMS devices are becoming more and more available and common. However, these devices are extremely small compared to regular machines, but still very large when compared to the individual circuits or components and features found on IC's and other electronic chips. Some MEMS devices such as the digital micromirror device arrays produced by Texas Instruments are made significantly smaller than most other types of MEMS devices, but are also very large compared to components on an IC or other chips and use existing geometry and patterning techniques common for the productions of semiconductor circuits. For example, small MEMS devices such as gimbal supported mirror 32 shown in FIG. 2D used for optical switching of transmitted data streams are presently on the order of 3.2×3.8 mm, whereas the mirrors on micromirror arrays used for display devices are typically between about 15–20 microns on a side. Thus, it is seen that MEMS devices are not comfortably compared with either full-size machines or devices (they are much smaller) or a true array of micro devices such as IC's, memory chips, and the like (they are much larger).

The present invention relates to individual mirror devices formed on a wafer using processing steps some of which have similarity to steps used in manufacturing IC's and other semiconductor devices.

SUMMARY OF THE INVENTION

The present invention provides a process for manufacturing a plurality of MEMS devices on a first layer of material, such as for example, a thin wafer of silicon typically having a thickness of about of 115 μm. The process comprises attaching the thin silicon wafer to a carrier or backing wafer and then defining features for each individual device of said plurality of devices with a first line width. The boundary or separation lines between the individual ones of the plurality of devices are defined with a second line width that has a thickness less than the thickness of the first line width used to define the device features.

After placing both the lines which define the features of the individual devices and the boundary or separation lines between individual devices, the wafer while attached to the backing wafer is etched such that the lines which define the features of the device are etched through the selected thickness. However, the etching is stopped before the thinner lines which define boundaries of the individual devices are etched through the thickness of the wafer. This is possible because of the phenomenon called microloading. Microloading is the differential etch rate between wide lines and narrow lines (wide lines etch faster) in a plasma reactor. Thus, it is seen that the individual devices are formed because of the fast etch rate of the wide lines, while at the same time all of the devices on the wafer remain attached together because of the slower etch rate of the thin separation line. The wafer with the devices still attached together is then separated from the backing layer. It should also be noted that the wafer with the devices could be silicon or another suitable material. Further, the wafer may also undergo other processes before the device is etched. For example, electronics, sensors or other mechanical features can be created by standard IC or MEMS fabrication before the process step of etching through the wafer is accomplished.

Therefore, according to embodiments of the present invention, the silicon wafer with all of the attached devices etched therein can then be further processed. For example, further processing may comprise testing of the torsional gimbals of the individual mirrors by moving the mirrors by either soft directed currents of air or spring pins. This is a much faster process than having to handle and test the gimbals on each separated mirror. In addition, it is also possible to better clean the attached mirror on the wafer after it has been released from its backing layer than it is to handle each individual device.

BRIEF DESCRIPTION OF THE DRAWINGS

The above-mentioned features as well as other features of the present invention will be more clearly understood from consideration of the following description in connection with the accompanying drawings in which.

DESCRIPTION OF THE PREFERRED EMBODIMENTS

Figure 1A:
FIGS. 1A through 1H illustrate the various steps of a manufacturing process.
Figure 1B:
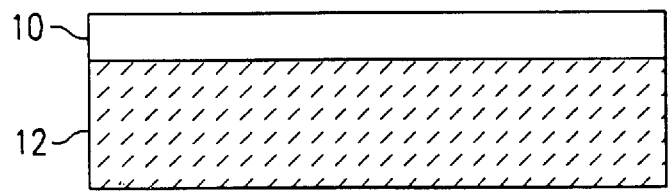
Figure 1C:
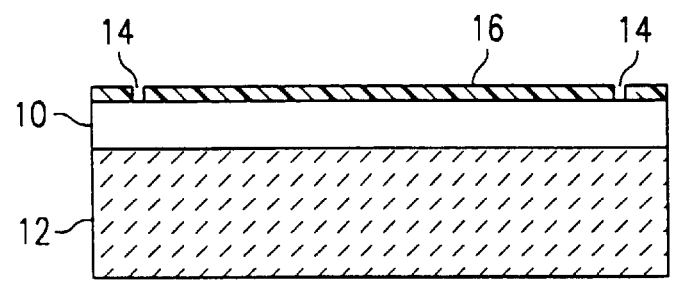
Figure 1D:
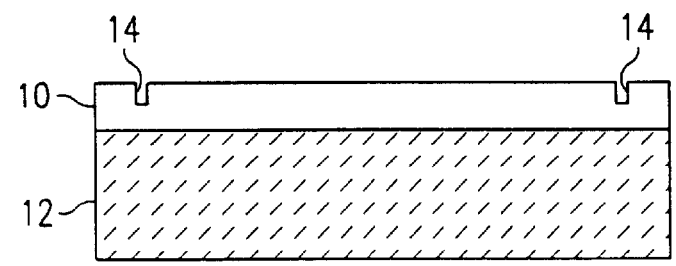
Figure 1E:
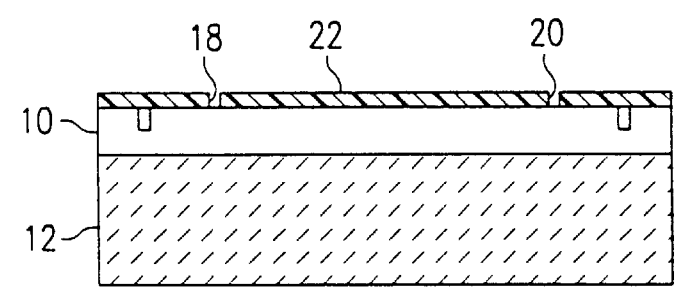
Figure 1F:
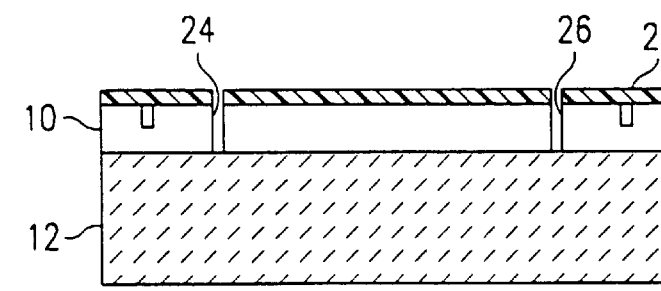
Figure 1G:
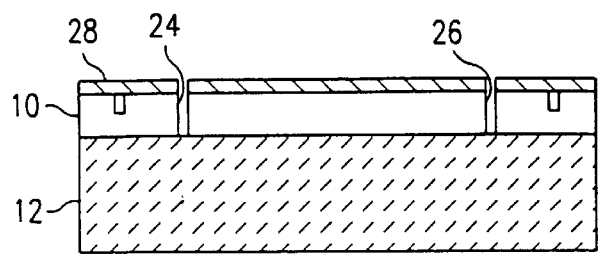
Figure 1H:
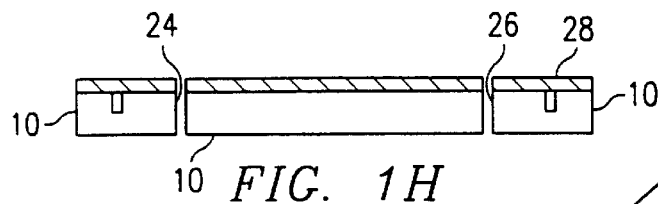

The process flow of one method of manufacturing two-axis analog micromirror MEMS devices wherein the individual dies, elements or devices are diced or separated by the same through the wafer etch that forms the features of the mirror is disclosed in FIGS. 1A–1H. As shown in FIG. 1A, a 115 μm thick wafer 10 is bonded to a carrier or backing wafer 12 (see FIG. 1B). Optional alignment marks 14 may then be etched into the thin wafer material or other suitable material using a resist layer 16 along with photolithography and plasma etching as shown in FIG. 1C. After the plasma etch, the resist 16 used to form the optional alignment marks 14 is then stripped as shown in FIG. 1D. The features of the micromirror or MEMS devices are then patterned with photolithography as indicated by line gaps 18 and 20 patterned in a second resist layer 22 as is well known by those skilled in the art. This arrangement is shown in FIG. 1E. As shown in FIG. 1F, the mirror features formed by gap or line pattern 18 and 20 are then etched completely through the wafer 10 as indicated by reference numbers 24 and 26 using a special ICP plasma reactor and the Bosch process U.S. Pat. No. 5,498,312. It is important to note at this point that according to this method of manufacturing, at the same time the mirror features such as were etched completely through the wafer 10, the line patterns or etches such as indicated at etch 26 used to separate the individual dies or mirrors as indicated at etch line 24 are also etched completely through the wafer 10. After the etching process, the second photo resist layer 22 is stripped away, and the wafer still bonded to the backing wafer is given a gold coat 28 such as shown in FIG. 1G. Finally, the mirror die or individual mirrors are released from the carrier wafer 12 as shown in FIG. 1H. This is accomplished by placing the combination carrier or backing wafer 12 and the wafer 10 in a solvent bath to dissolve the agent bonding the carrier wafer 12 and wafer 10 together. The bonding agent is typically a photo resist. Therefore, according to one embodiment, the solvent for separating the backing wafer 12 from the wafer 10 is acetone.

Figure 2A:
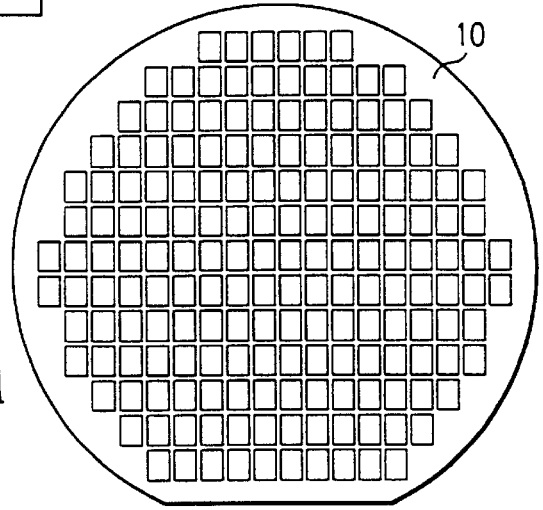
FIG. 2A illustrates a mirror wafer.
Figure 2B:
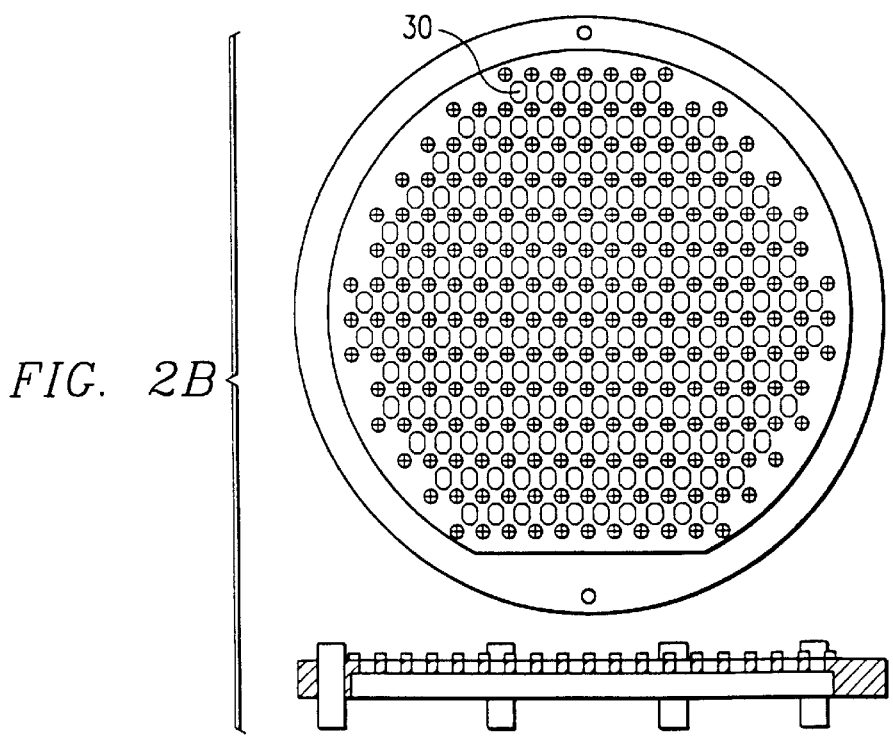
FIG. 2B shows a top view and a side view of the fixture for catching the individual mirror devices upon release.
Figure 2C:
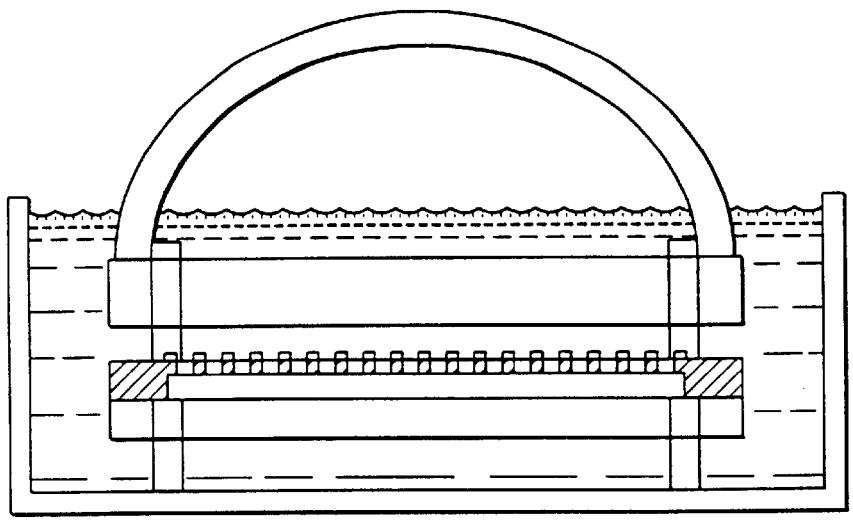
FIG. 2C is a cross-section of the apparatus used to release the silicon device from the backing wafer used by a manufacturing process.
Figure 2D:
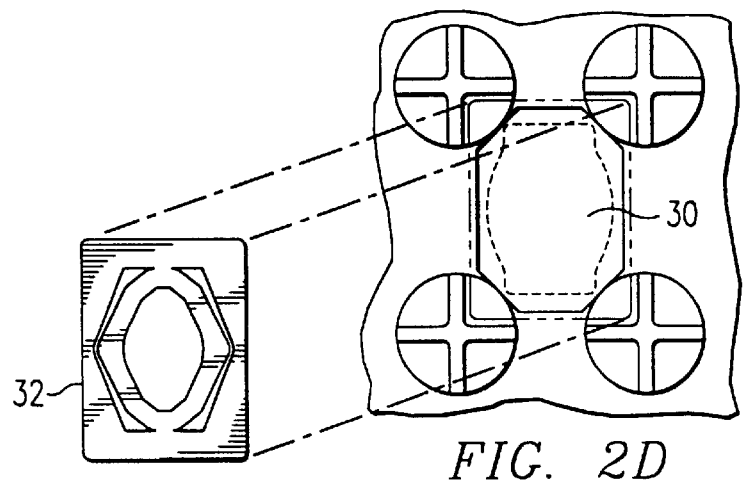
FIG. 2D is an enlarged view of a pocket on the fixture of FIG. 2B and also shows an individual mirror device caught by the fixture of FIG. 2B.

Referring now to FIGS. 2A, 2B, 2C and 2D, there is shown the wafer 10 with the individual mirrors etched therein, a fixture for catching the individual dies or mirrors after they are released from the backing or carrier wafer 12 (top and side view shown in FIG. 2B), and a cross-sectional view of the solvent bath with the wafer 10 and fixture of 2B in place as used during the release process (FIG. 2C). As shown in FIG. 2A, the embodiment illustrates 178 individual mirrors or dies etched into the wafer 10. Likewise, the fixture of 2B shows an equal number or 178 pockets such as pocket 30 more clearly seen in the broken out blown up illustration of FIG. 2D, which catch the individual mirrors or dies, such as mirror and gimbal structure 32, after they are released. The mirror wafer 10 is aligned on the fixture of FIG. 2B so that each individual mirror is over a pocket 30 that catches the mirror after release. As shown in FIG. 2C, the bonded wafer 10 is loaded upside down in the fixture so that gravity will pull the individual mirrors down into an aligned pocket as they are released from the carrier wafer 12.

This process requires non-standard semiconductor practices and consequently experiences some problems that may reduce yield. For example, each individual die or mirror can have residue on the die resulting from the release process; (2) each of the die can get drying spots where they land on the released fixture; (3) some breakout pieces of the original wafer 10 (to be discussed hereinafter) can get stuck to the mirror die; and (4) some of the die or individual mirrors 32 simply never get released from the carrier wafer 12 or they get re-stuck to the carrier wafer 12 when the acetone or alcohol used in a subsequent rinse dries (due to capillary forces). Furthermore, as mentioned, this process is also different from standard semiconductor assembly practices because it is very difficult to ship the individual dies that have been released from the carrier wafer since they break rather easily during routine handling. Also, there is no way other than an optical inspection of each individual die or mirror to identify the known good mirrors. However, optical inspection of such small items is extremely difficult and expensive. There are also no mechanical or electrical tests that can be performed on the individual mirrors or dies while they are still bonded to the backing layer to verify whether the mirrors are good or faulty.

Consequently, since it is very difficult to ship, (if shipping is to occur) the individual dies because they are fragile and cannot be shipped using the accepted methods for shipping electronic die, such as gel-track trays or chip trays. Therefore according to this process, the bonded combination wafer 10 and backing wafer 12 must be shipped. Thus, the release process must also be transferred to the assembly vendor. This means that there may be no yield data available on the mirror dies until final testing of the assembled micromirrors and may result in an inability to determine the cause of defaults or the particular process steps or areas where the defaults occur.

Figure 3A:
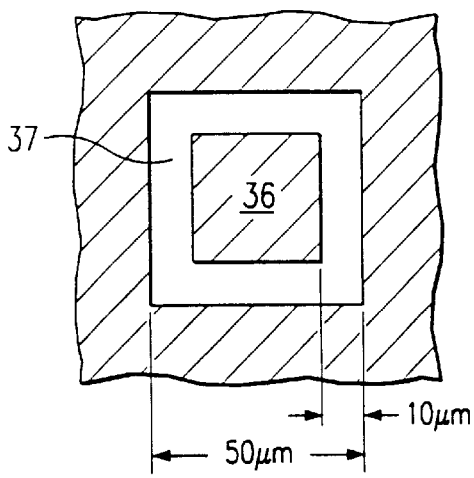
FIGS. 3A and 3B illustrate two methods of removing wafer waste areas greater than about 50 μm.
Figure 3B:
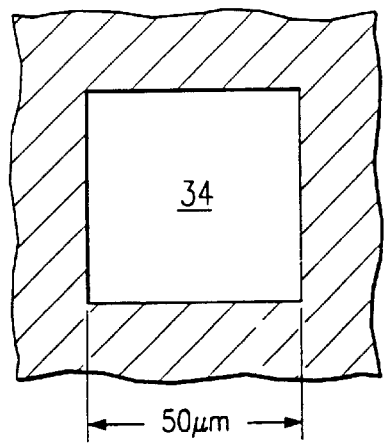
Figure 3C:
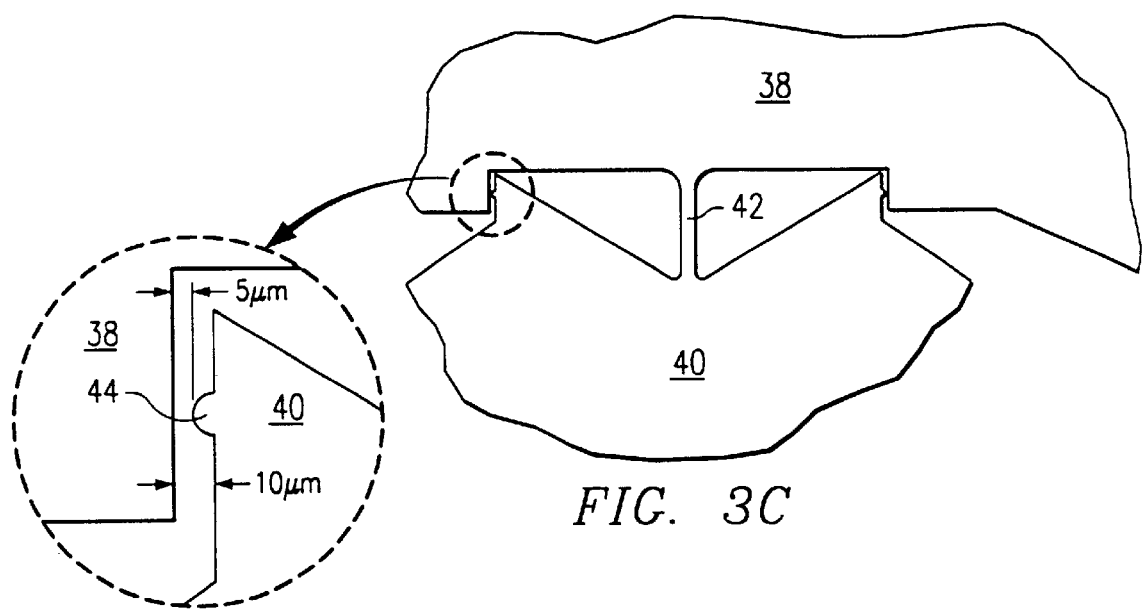
FIG. 3C illustrates how device features having a separation less than a narrow line width may be formed by a first method.

The present invention relates to individual mirror devices formed on a wafer using processing steps some of which have similarity to steps used in manufacturing IC's and other semiconductor devices. Referring again to the process discussed with respect to FIGS. 1A through 1H, it is noted that the described process follows "mask" guidelines which required all features on the wafer or each individual device to be created by etching trenches, for example, having a 10 μm width. This rule or guideline was typically included or followed because of "microloading" which occurs with plasma etching. As discussed above, microloading results because lines of different widths etch at different rates, and more specifically, "wide" lines etch at a faster rate than "thin" lines. Thus, to provide consistency in etching of features, a standard rule is that all lines including features and separating lines are to be etched by lines 10 μm in width. Consequently, as shown in FIGS. 3A and 3B, if an area 34 (FIG. 3B), that is larger than 10 μm is to be removed, the process discussed above with respect to FIG. 1A through 1h required etching 10 μm lines 37 around the area to be removed so as to leave a break-away area or piece 36 as shown in FIG. 3A. For example in FIGS. 3A and 3B, the area to be removed is 50 μm. This break-away piece or area 36 is then removed after the etching release process. The break-away area or piece 36 will typically simply fall away after the individual dies or mirrors are removed from the backing wafer 12. A potential problem with this process is that sometimes the break-away areas or pieces 36 are not removed, but instead, stick to one of the mirror devices and cause a failure. FIG. 3C illustrates the gimbal support structure 38 and a mirror 40 attached to the gimbal support structure 38 by a torsion hinge 42, as well as a blow up view of an alignment stop 44 (there may be more than one) between structure 38 and mirror 40 as formed by this process. This illustration shows how all etch lines may be limited to a minimum of 10 μm, yet some parts of the structure may be divided by a spacing less than 10 μm.

Other difficulties or problems with the above discussed method are when the layer 10 with the individual devices was released from the backing wafer 12.

Figure 4:
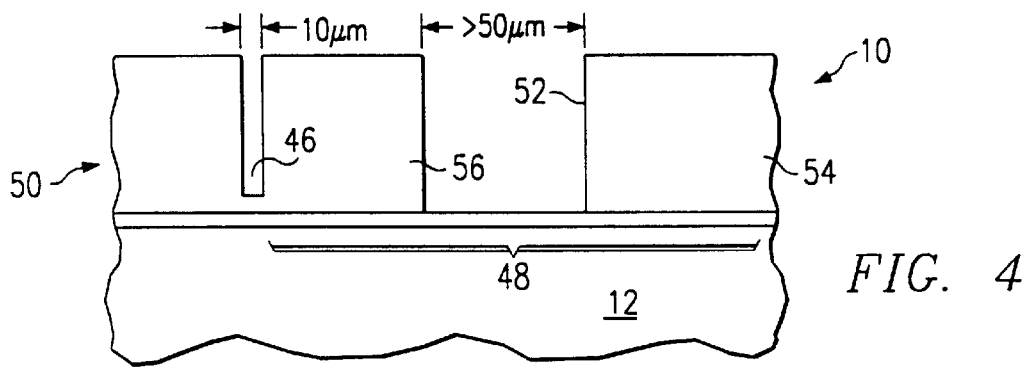
FIG. 4 illustrates the use of wide separation lines to define device features and narrow separation lines to define devices according to the present invention.
Figure 5:
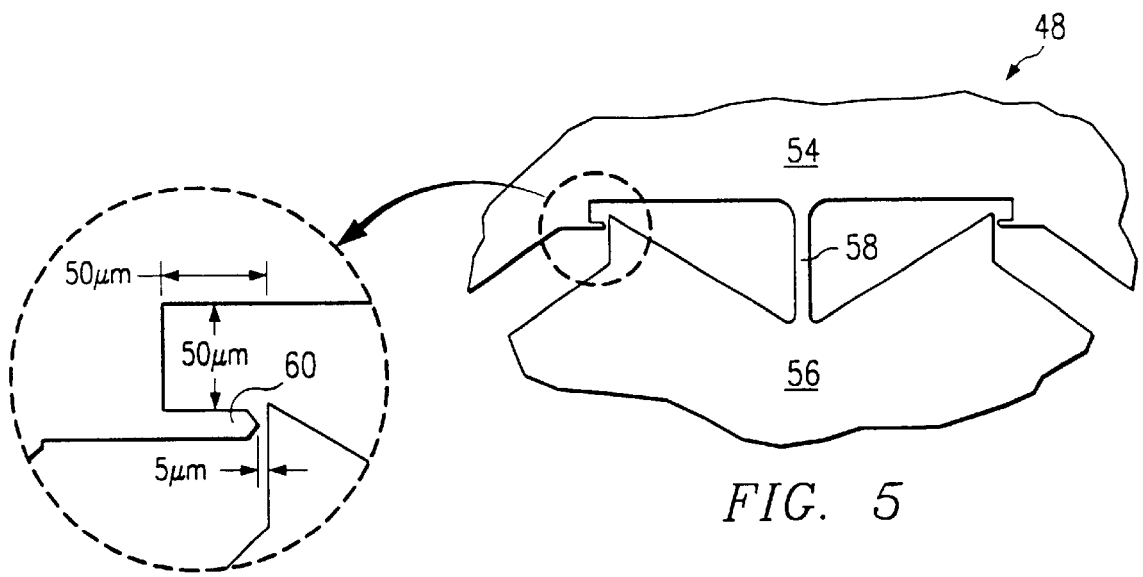
FIG. 5 illustrates how device features having a separation less than a selected line width may be formed according to the present invention.
Figure 7:
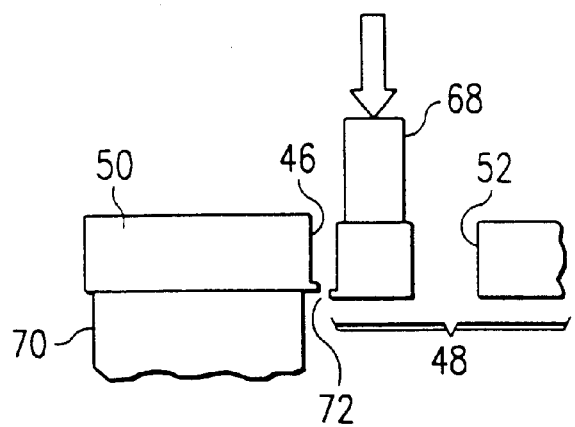
FIG. 7 illustrates a method of separating the individual devices on a wafer.

The process of this invention uses the differences in "microloading" or in etch rates of wide lines and narrow lines advantageously. For example, the process of the present invention may follow the method discussed above with respect to FIGS. 1A through 1H from FIGS. 1A through FIG. 1D. However, as shown in FIG. 4, according to the present invention, narrow lines 46 are used as the dividing or separation lines between individual dies (devices such as the mirror device 48 and 50), whereas "wide" etching lines such as lines 52 in the illustrated embodiment have a ratio of greater than 4:1 with respect to the narrow lines 46 and are used to define features of an individual device formed on the 115 µm wafer 10. As examples only, the individual devices are separated by lines having a width of 10 µm, and the features in FIGS. 4, 5 and 7 are shown as being defined by lines equal to or greater than 50 µm. For example, in the embodiment shown in FIG. 4, line 52 separates mirror 54 from gimbal structure 56. Therefore, as also illustrated, the features on individual devices formed by the fast etching 50 µm lines (such as line 52) are completely etched through the 115 µm wafer 10 before the slower etching 10 µm separation lines 46 are able to etch through the wafer. FIG. 5 shows formation of the torsional hinge or support 58 and an alignment stop 60 using 50 µm lines for separating features as formed by the process of the present invention. It will be appreciated by those skilled in the art that although silicon is often preferred for such processes, other suitable materials such as, but not limited to, gallium arsenide, quartz and silicon carbide may also be used.

Therefore, by stopping the etching process after the complete etching of the wide lines (e.g. line 52), but before the narrow lines (e.g. line 46) can etch through the wafer, all of the individual devices (or according to the embodiment discussed above the individual 178 mirrors and their gimbal structure) are all still attached to each other. This allows the multiplicity of devices etched into the 115 µm wafer 10 to be removed from the backing wafer 12 still in the shape of a wafer or as a single unit. Since all of the individual devices or "dies" are still attached to each other, they are all more likely to separate from the backing wafer 12 than was the case using the method discussed above with respect to FIGS. 1A–1H and 2A–2C. Thus, the yield will increase.

Figure 6A:
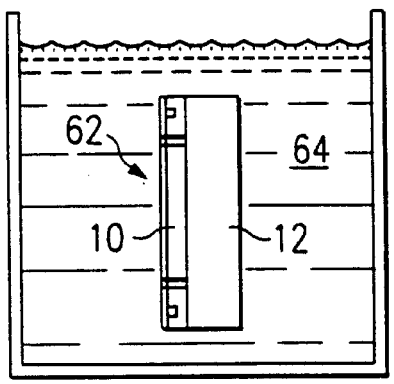
FIGS. 6A through 6C illustrates a method of manually separating the device wafer from the backing wafer according to the present invention.
Figure 6B:
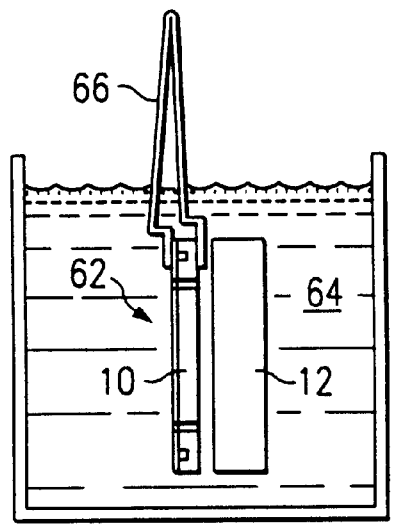
Figure 6C:
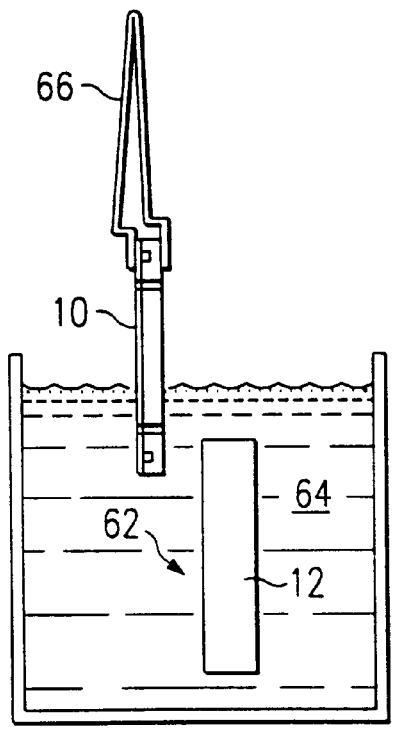

A process for releasing wafer 10 from its backing wafer 12 and then cleaning the released "etched" wafer 10 is illustrated and discussed with respect to FIGS. 6A through 6C. For example, as shown in FIG. 6C, the wafer combination 62 consisting of etched wafer 10 and backing wafer 12 is soaked in acetone 64 for a selected period of time to substantially dissolve the adhesive (for example, resist) which bonds the wafer 10 to backing wafer 12. Then as shown in FIG. 6B, an edge of the wafer 10 with the individual devices etched therein is then gripped such as by tweezers 66 and slid or pulled off of the carrier wafer 12 as shown in FIG. 6C. This process can also be done by automated tooling. The removed wafer 10 is then preferably soaked in a fresh bath of clean acetone for about five minutes to remove any residue so as to avoid spots on the devices. The micromirror wafer should quickly be placed in the fresh bath to assure that the wafer stays wet with acetone. After the wafer has been soaked in the fresh acetone bath, the wafer is preferably rinsed in a hot IPA bath for about five minutes. The wafer is then removed from the hot IPA bath. The removal of the wafer 10 from the hot IPA bath may be a slow process so that the IPA sheets off of the wafer or alternately, the wafer may be dried using an IPA vapor dryer.

As was disclosed above, it is extremely difficult to test the individual mirrors after they have been separated from each other according to the process discussed with respect to FIGS. 1A–1H. However, it is now possible to carefully clamp the etched wafer 10 with all 178 mirrors and gimbals in a fixture and then test the individual devices or mirrors to determine defects by applying a slight force. For example, a spring pin or air pressure may be used to verify proper movement of the mirrors. Subsequent to testing, the individual devices or gimbal mirror a structure on the wafers such as structures 48 and 50 can then be separated from each other by using a punch 68 and anvil 70 to crack the connecting material 72 which remains in the area of the 10 µm lines 46 after etching. This is shown in FIG. 7.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A process for manufacturing a plurality of MEMS devices on a first layer of material of a selected thickness comprising:
   attaching said first layer of material to a backing layer of material;
   defining features on each individual ones of said plurality of MEMS devices with first lines having at least a first selected width;
   defining boundary lines between individual ones of said plurality of MEMS devices with second lines having a width that is less than said first selected width;
   simultaneously etching said first lines and said second lines until said first lines defining device features are etched through said selected thickness;
   stopping said etching before said second lines defining boundaries are etched through said first selected thickness; and
   separating said first layer with said plurality of devices attached together from said backing layer.

2. The process of claim 1 and comprising further processing of said separated first layer.

3. The process of claim 2 when said further processing comprising testing said devices while still attached together on said first layer.

4. The process of claim 2 wherein said further processing comprises separating each individual device of said first layer from each other.

5. The process of claim 1 wherein said further processing comprises cleaning said devices while still attached together subsequent to said separation step.

6. The process of claim 1 and further comprising packing said separated wafer with said devices still attached together for storage or shipping.

7. The process of claim 1 wherein said first width of said first lines have a ratio greater than 4:1 with respect to said width of said second lines.

8. The process of claim 1 wherein said first selected width is at least about 50 µm and said second width is about 10 µm.

9. The process of claim 1 wherein said first layer of material is selected from the group consisting of silicon, gallium arsenide, quartz and silicon carbide.

10. The process of claim 9 wherein said first layer of material is silicon.

11. A process for manufacturing a plurality of gimbal mirror devices on a first layer of material of a selected thickness comprising:

attaching said first layer of material to a backing layer of material;

defining features on each individual ones of said plurality of gimbal mirror devices with first lines having at least a first selected width;

defining boundary lines between individual ones of said plurality of gimbal mirror devices with second lines having a width that is less than said first selected width;

simultaneously etching said first lines and said second lines until said first lines defining gimbal mirror features are etched through said first selected thickness;

stopping said etching before said second lines defining boundaries are etched through said first selected thickness; and separating said first layer with said plurality of gimbal mirror devices attached together from said backing layer.

12. The process of claim 11 further comprising testing individual devices defined on said first layer.

13. The process of claim 11 further comprising separating each individual gimbal mirror device from said first layer.

14. The process of claim 11 wherein said further processing comprises cleaning said gimbal mirror while still attached together subsequent to said step of separating said first layer from said backing layer.

15. The process of claim 11 and further comprising packing said separated wafer with said devices still attached together for storage or shipping.

16. The process of claim 11 wherein said first lines have a width at least equal to about 50 $\mu$m and said second lines have a width of about 10 $\mu$m.

17. The process of claim 11 wherein said first layer is a silicon wafer.

* * * * *